United States Patent [19]
Davies et al.

[11] Patent Number: 5,811,341
[45] Date of Patent: Sep. 22, 1998

[54] DIFFERENTIAL AMPLIFIER HAVING UNILATERAL FIELD EFFECT TRANSISTORS AND PROCESS OF FABRICATING

[75] Inventors: Robert B. Davies, Tempe; Andreas A. Wild, Scottsdale, both of Ariz.

[73] Assignee: Motorola, Inc., Schaumburg, Ill.

[21] Appl. No.: 762,170

[22] Filed: Dec. 9, 1996

[51] Int. Cl.$^6$ .................................. H01L 21/336
[52] U.S. Cl. .................... 438/279; 438/286; 438/304
[58] Field of Search .................... 438/279, 286, 438/304, 595, 596

[56] References Cited

U.S. PATENT DOCUMENTS

| | | | |
|---|---|---|---|
| 5,061,647 | 10/1991 | Roth et al. | 438/304 |
| 5,372,960 | 12/1994 | Davies et al. | 438/291 |
| 5,427,964 | 6/1995 | Kaneshiro et al. | 438/286 |
| 5,441,906 | 8/1995 | Burger | 438/286 |
| 5,545,575 | 8/1996 | Cheng et al. | 438/304 |
| 5,612,244 | 3/1997 | Davies et al. | 438/286 |

OTHER PUBLICATIONS

"Field Effect–Transistor with Asymmetrical Structure", Codella et al., United States Statutory Invention Registration Number H986, Published Nov. 5, 1991, U.S. Class 438, Subclass 286, Application Filing Date Jun. 9, 1989.

*Primary Examiner*—Chandra Chaudhari
*Attorney, Agent, or Firm*—Rennie William Dover; Ziye Zhou

[57] ABSTRACT

A differential amplifier (10) includes three unilateral field effect transistors (12, 14, 16) formed in a common well (40) of a semiconductor material. Each of the three unilateral field effect transistors (12, 14, 16) has an asymmetric channel doping profile. The performance of the differential amplifier (10) is significantly improved by properly orienting the three unilateral field effect transistors (12, 14, 16).

14 Claims, 5 Drawing Sheets

DIFFERENTIAL AMPLIFIER HAVING UNILATERAL FIELD EFFECT TRANSISTORS AND PROCESS OF FABRICATING

BACKGROUND OF THE INVENTION

The present invention relates, in general, to differential amplifiers and, more particularly, to improving the performance of differential amplifiers.

Differential amplifiers are widely used in analog circuit, mixed mode circuit, and digital circuit applications. In metal oxide silicon (MOS) technologies, a differential amplifier typically comprises three insulated gate field effect transistors (IGFETs). An IGFET has a source region, a drain region, and a channel region therebetween. A conventional IGFET is a symmetric device in the sense that its channel region has a symmetric doping profile. The characteristics, such as threshold voltages, transconductances, gate capacitances, and current carrying capabilities, of the IGFET are determined by geometric and process parameters of the IGFET, such as channel length, channel width, dopant concentration in the channel region, the gate oxide thickness, the source and drain junction depths, etc. The performance of the differential amplifier, such as gain, output impedance, frequency response, etc., are related to the characteristics of the transistors.

Accordingly, it would be advantageous to have a differential amplifier and a process of fabricating the differential amplifier. It is desirable for the process to provide improved performance of the differential amplifier by optimizing the characteristics of the transistors in the amplifier. It is also desirable for the differential amplifier to have a high packing density.

DETAILED DESCRIPTION OF THE DRAWINGS

Generally, the present invention provides a differential amplifier and a process of fabricating the differential amplifier. The differential amplifier fabricated in accordance with the present invention has improved performance, such as higher gain, higher output impedance, higher frequency response, wider bandwidth, etc. compared with a differential amplifier fabricated using a conventional MOS process. More particularly, the differential amplifier of the present invention includes three unilateral field effect transistors. Each unilateral field effect transistor has an asymmetric doping profile in the channel region. Preferably, the source side dopant concentration in the channel region of the unilateral field effect transistor is higher than the drain side dopant concentration. Such a unilateral field effect transistor has higher transconductance and current carrying capability than a conventional field effect transistor. By properly orienting each unilateral field effect transistor in the differential amplifier, the performance of the differential amplifier is improved. Furthermore, the three unilateral transistors of the differential amplifier are preferably fabricated in a common well to increase the packing density of an integrated circuit which includes the differential amplifier.

Figure 1:
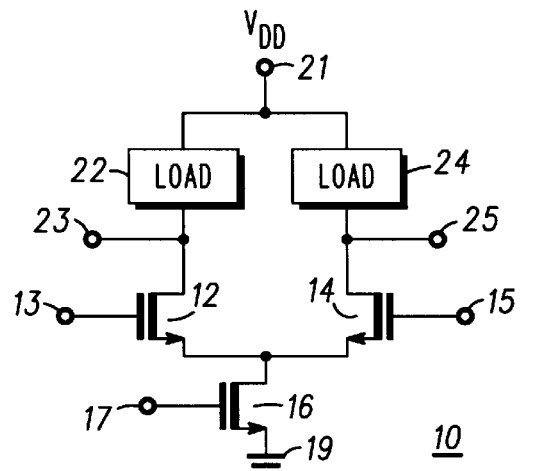
FIG. 1 is a schematic diagram of a differential amplifier in accordance with the present invention.

FIG. 1 is a schematic diagram of a differential amplifier 10 in accordance with the present invention. Differential amplifier 10 includes three unilateral field effect transistors 12, 14, and 16. By way of example, transistors 12, 14, and 16 are N-channel field effect transistors. A gate electrode of transistor 12 is connected to an input terminal 13 for receiving a first input signal of differential amplifier 10. A source electrode of transistor 12 is connected to a source electrode of transistor 14 and to a drain electrode of transistor 16. A gate electrode of transistor 16 is connected to a bias terminal 17 for receiving a bias signal of differential amplifier 10. A source electrode of transistor 16 is connected to conductor 19 for receiving a reference voltage signal. By way of example, conductor 19 is at ground voltage level. A gate electrode of transistor 14 is connected to an input terminal for receiving a second input signal of differential amplifier 10. The drain electrodes of transistors 14 and 16 are coupled to a conductor 21 via loads 22 and 24, respectively. By way of example, conductor 21 is at a supply voltage level of VDD. The drain electrode of transistor 12 is further connected to an output terminal 23 for transmitting a first output signal of differential amplifier 10. Likewise, the drain electrode of transistor 14 is further connected to an output terminal 25 for transmitting a second output signal of differential amplifier 10.

Transistor 16 serves as a current sink which draws a substantially constant current from transistors 12 and 14. Transistors 12 and 14 form a differential pair and amplify a differential input signal transmitted to differential amplifier 10 via input terminals 13 and 15. Loads 22 and 24 function as current sources and may be resistors, transistors, etc. Preferably, the characteristics of transistor 12 are substantially identical to the characteristics of transistor 14, and the characteristics of load 22 are substantially identical to the characteristics of load 24.

In operation, a bias signal is transmitted to the gate electrode of transistor 16 via bias terminal 17. Preferably, the bias signal has a voltage level higher than the threshold voltage of transistor 16. Therefore, current sink transistor 16 is conductive. When the differential input signal has a positive polarity in the sense that the voltage level at input terminal 13 is higher than the voltage level at input terminal 15, transistor 12 conducts a larger current than does transistor 14. The voltage drop across load 22 is larger than the voltage drop across load 24, and output terminal 23 is at a lower voltage level than output terminal 25. When the differential input signal has a negative polarity in the sense that the voltage level at input terminal 13 is lower than the voltage level at input terminal 15, transistor 12 conducts a smaller current than does transistor 14. The voltage drop across load 22 is smaller than the voltage drop across load 24, and output terminal 23 is at a higher voltage level than output terminal 25. Therefore, differential amplifier 10 generates a differential output signal at output terminals 23 and 25.

The performance characteristics of differential amplifier 10, such as gain, output impedance, bandwidth, frequency response, etc., depend on the parameters, such as threshold voltages, gate capacitances, transconductances, and current carrying capabilities, of transistors 12, 14, and 16. Using unilateral field effect transistors for transistors 12, 14, and 16 will significantly improve the performance of differential amplifier 10. A unilateral field effect transistor is defined as a field effect transistor having an asymmetric lateral doping profile in its channel region. More particularly, the dopant concentration on the source side of the channel region is higher than the dopant concentration on the drain side of the channel region. The structures and fabrication processes of some unilateral field effect transistor are described in U.S. Pat. No. 5,372,960 entitled "Method of Fabricating an Insulated Gate Semiconductor Device" and issued to Davies et al. on Dec. 13, 1994, U.S. Pat. No. 5,441,906 entitled "Insulated Gate Field Effect Transistor Having a Partial Channel and Method for Fabricating" and issued to Burger on Aug. 15, 1995, and U.S. Pat. No. 5,427,964 entitled "Insulated Gate Field Effect Transistor and Method for Fabricating" and issued to Kaneshiro et al. on Jun. 27, 1995, which are incorporated herein by reference.

It should be understood that a unilateral field effect transistor is an asymmetric device. The characteristics, such as threshold voltage, gate capacitance, transconductance, etc., of a unilateral field effect transistor depend on the direction of carrier motion in the channel of the transistor. For example, the characteristics of a unilateral field effect transistor are usually superior when carriers in the channel of the transistor move from the source to drain rather than when the carries in the channel of the transistor move from the drain to the source. Therefore, when using unilateral field effect transistors in differential amplifier 10, it is important to properly orient transistors 12, 14, and 16.

Figure 2:
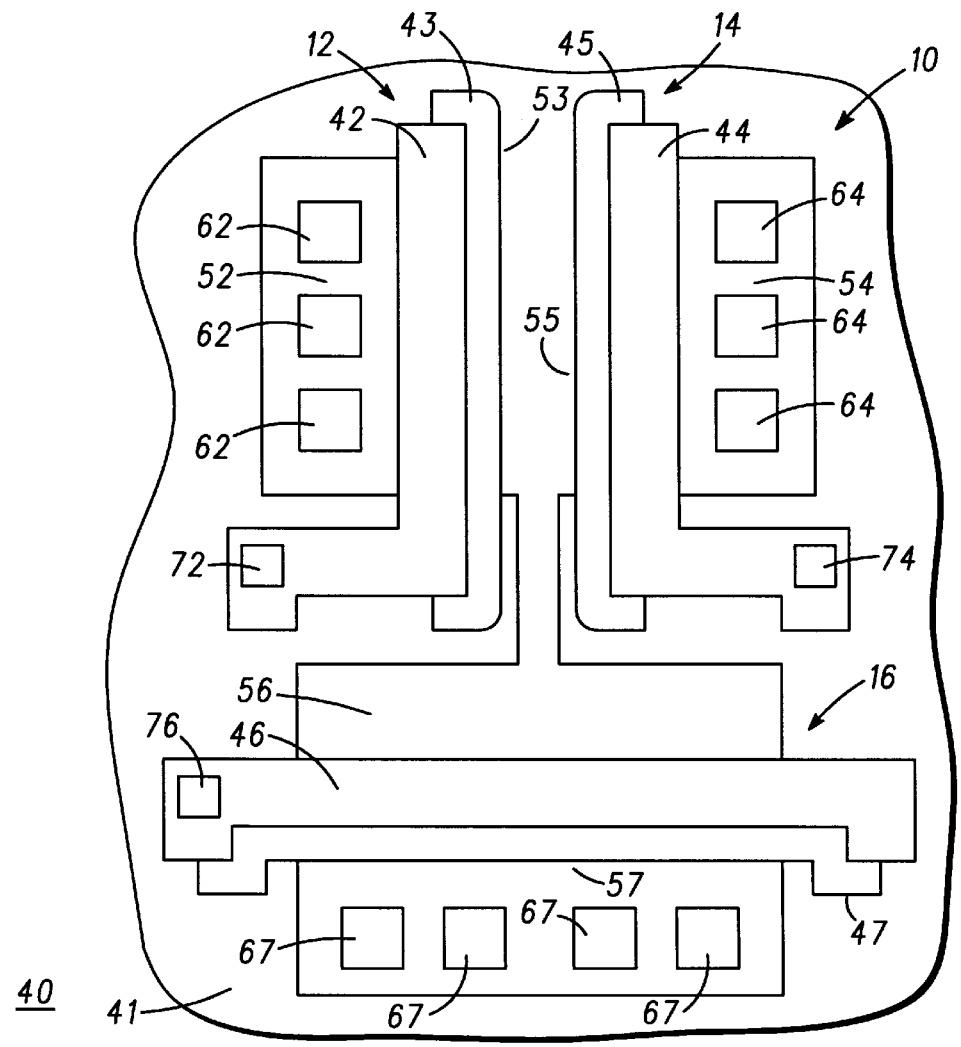
FIG. 2 is a top view of a portion of the differential amplifier of FIG. 1 formed in a well of a semiconductor material in accordance with the present invention.

FIG. 2 is a top view of a portion of differential amplifier 10 of FIG. 1 formed in a well 40 of a semiconductor material of a first conductivity type in accordance with the present invention. It should be understood that the same reference numerals are used in the figures to denote the same elements. By way of example, well 40 has a major surface 41 and is of P conductivity type. Transistors 12, 14, and 16 are three unilateral field effect transistors formed in well 40.

Each gate structure of transistors 12, 14, and 16 comprises two conductive portions: a conductive portion near the drain region of the device which serves as a shunt electrode and an extension, i.e., a second conductive portion, adjacent the source region of the device which serves as an active gate structure. The active gate structure is electrically coupled to the shunt electrode. In other words, the gate of transistor 12 includes shunt electrode 42 near drain region 52 and active gate structure 43 near source region 53 of transistor 12. Similarly, the gate of transistor 14 includes shunt electrode 44 near drain region 54 and active gate structure 45 near source region 55 of transistor 14, and the gate of transistor 16 includes shunt electrode 46 near drain region 56 and active gate structure 47 near source region 57 of transistor 16. Each of shunt electrodes 42, 44, and 46 comprises a conductive layer formed on a first portion of a gate dielectric layer (not shown) near the respective drain regions 52, 54, and 56. Each of active gate structures 43, 45, and 47 comprises a conductive sidewall spacer formed on a second portion of the gate dielectric layer (not shown) near the respective source regions 53, 55, and 57. The thickness of the first portion of the gate dielectric layer in each of transistors 12, 14, and 16 is preferably greater than the thickness of the respective second portion of the gate dielectric layer. Therefore, the gate capacitances of transistors 12, 14, and 16 are reduced compared with transistors fabricated using conventional methods, and higher frequency response and wider bandwidth of differential amplifier 10 are achieved.

The P-type doping profiles in the channel regions (not shown) of transistors 12, 14, and 16 are asymmetric. More particularly, the P-type dopant concentrations near source regions 53, 55, and 57, are higher the P-type dopant concentrations near the respective drain regions 52, 54, and 56. The asymmetric doping profiles in the channel regions improve the controllability of the threshold voltages of transistors 12, 14, and 16. Further, the asymmetric doping profiles improve the transconductances of transistors 12, 14, and 16. Therefore, the performance characteristics of differential amplifier 10, e.g., gain and output impedance, are improved.

Source region 53 of transistor 12 and source region 55 of transistor 14 are electrically connected to drain region 56 of transistor 16. Drain contacts 62 are formed in drain region 52 of transistor 12, drain contacts 64 are formed in drain region 54 of transistor 14, and source contacts 67 are formed in source region 57 of transistor 16. Further, gate contacts 72, 74, and 76 are formed on gate portions 42, 44, and 46, respectively. Transistors 12 and 14 function as a differential pair, and transistor 16 functions as a current sink. To minimize the signal distortion of the differential amplifier 10, the geometric and process parameters, such as channel length, channel width, doping profile, etc. of transistor 12 are preferably substantially equal to the corresponding parameters of transistor 14. Transistor 16 preferably has a large channel width, e.g., equal to or greater than the channel widths of transistors 12 and 14, so that transistor 16 has a large current carrying capability.

In operation, gate contacts 72 and 74 of transistors 12 and 14, respectively, are coupled for receiving a differential input signal. Drain contacts 62 and 64 of transistors 12 and 14, respectively, are coupled for transmitting a differential output signal. Drain contacts 62 and 64 are further coupled for receiving a supply voltage, e.g., VDD, via loads 22 and 24 (shown in FIG. 1), respectively. Gate contact 76 of transistor 16 is coupled for receiving a bias signal of differential amplifier 10. Source contacts 67 of transistor 16 are coupled for receiving a reference voltage. e.g., ground voltage.

FIGS. 3–10 illustrate, in highly enlarged cross-sectional views, a process of fabricating a unilateral field effect transistor 100 in accordance with the present invention. Transistor 100 could be used for transistors 12, 14, or 16 in differential amplifier 10 of FIGS. 1 and 2. It should be understood that the materials, concentrations, and thicknesses provided in the description of the present invention merely serve as examples and are not limitations of the present invention.

Figure 3:
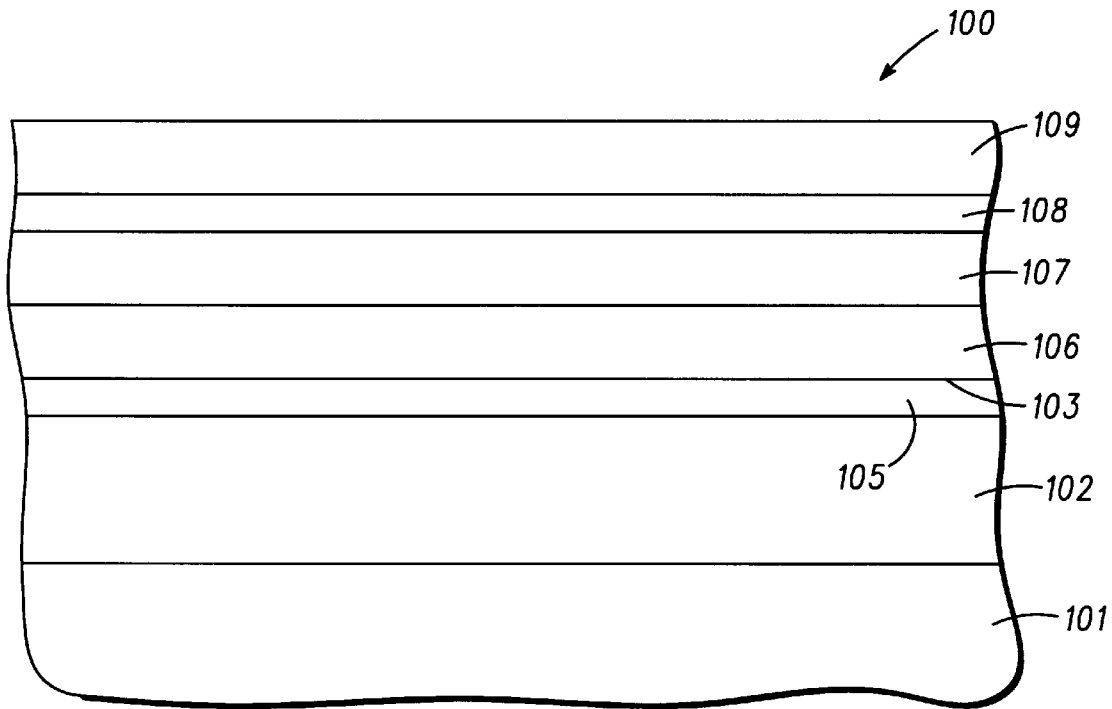
FIGS. 3–10 illustrate, in highly enlarged cross-sectional views, a process of fabricating a unilateral field effect transistor that is used in the differential amplifier of FIGS. 1 and 2 in accordance with the present invention.

FIG. 3 illustrates an enlarged cross-sectional view of a portion of partially completed unilateral insulated gate field effect transistor 100 during processing. By way of example transistor 100 is an N-channel field effect transistor. What is shown in FIG. 3 is a substrate 101 of P conductivity type having an epitaxial layer 102 disposed thereon. By way of example, epitaxial layer 102 is of P conductivity type, has a major surface 103, and ranges in thickness between approximately 2 micrometers ($\mu$m) and approximately 5 $\mu$m. Substrate 101 has, for example, a resistivity ranging from approximately 0.01 ohm-centimeter ($\Omega$-cm) to approximately 0.1 $\Omega$-cm, and P-type epitaxial layer 102 has a resistivity between approximately 6 $\Omega$-cm and approximately 8 $\Omega$-cm. P-type epitaxial layer 102 has a dopant concentration on the order of $5 \times 10^{15}$ atoms per cubic centimeter (atoms/cm$^3$). Although the description of the present invention includes the combination of substrate 101 and P-type epitaxial layer 102 to prevent latch-up, it should be understood that insulated gate field effect transistors of the present invention may be manufactured in a semiconductor material that has doping characteristics substantially the same the doping characteristics of epitaxial layer 102.

A doped layer 105 of N conductivity type is formed in a portion of P-type epitaxial layer 102. Doped layer 105 extends from major surface 103 into epitaxial layer 102. Although doped layer 105 is shown as extending across an entire portion of P-type epitaxial layer 102, it should be understood that doped layer 105 may be formed to extend across a subportion of the P-type epitaxial layer 102. Doped layer 105 permits the formation of a portion of the gate oxide layer to be sufficiently thick to reduce the gate capacitance, thereby improving the frequency response of the field effect transistors. By way of example, layer 105 has a dopant concentration ranging from approximately $7\times10^{16}$ atoms/cm$^3$ to approximately $2\times10^{17}$ atoms/cm$^3$. A suitable set of implant conditions to obtain the aforementioned dopant concentration includes: an implant dose ranging from approximately $1\times10^{12}$ atoms per square centimeter (atoms/cm$^2$) to approximately $3\times10^{12}$ atoms/cm$^2$ and an implant energy for ranging from approximately 50 kilo-electron volts (KeV) to approximately 200 KeV.

A layer of dielectric material 106 is formed on major surface 103. A suitable technique for forming oxide layer 106 is thermal oxidation. Preferably, oxide layer 106 has a thickness of at least 400 angstroms (Å). In accordance with an embodiment of the present invention, oxide layer 106 has a thickness in the range of approximately 600 Å to approximately 1,800 Å. A typical thickness of oxide layer 106 is approximately 1,200 Å. It should be noted that a portion of oxide layer 106 serves as a portion of a gate oxide for transistor 100.

A layer of polysilicon 107 is formed on oxide layer 106 using, for example, a chemical vapor deposition technique. A suitable thickness range for polysilicon layer 107 is from approximately 2,500 Å to approximately 4,000 Å. A typical thickness for polysilicon layer 107 is approximately 3,300 Å. A layer of dielectric material 108 is formed on polysilicon layer 107. For example, layer of dielectric material 108 is a layer of oxide formed by the decomposition of tetraethyl orthosilicate (TEOS). Oxide layers formed by the decomposition of tetraethyl orthosilicate are commonly referred to as TEOS layers. By way of example, oxide layer 108 has a thickness ranging from approximately 50 Å to approximately 400 Å. A nominal thickness for oxide layer 108 is approximately 150 Å. A layer of silicon nitride 109 is formed on layer of dielectric material 108 using, for example, a low pressure chemical vapor deposition (LPCVD) technique. A suitable range of thicknesses for silicon nitride layer 109 is between approximately 150 Å and approximately 350 Å, and a nominal thickness for silicon nitride layer 109 is approximately 250 Å.

Figure 4:
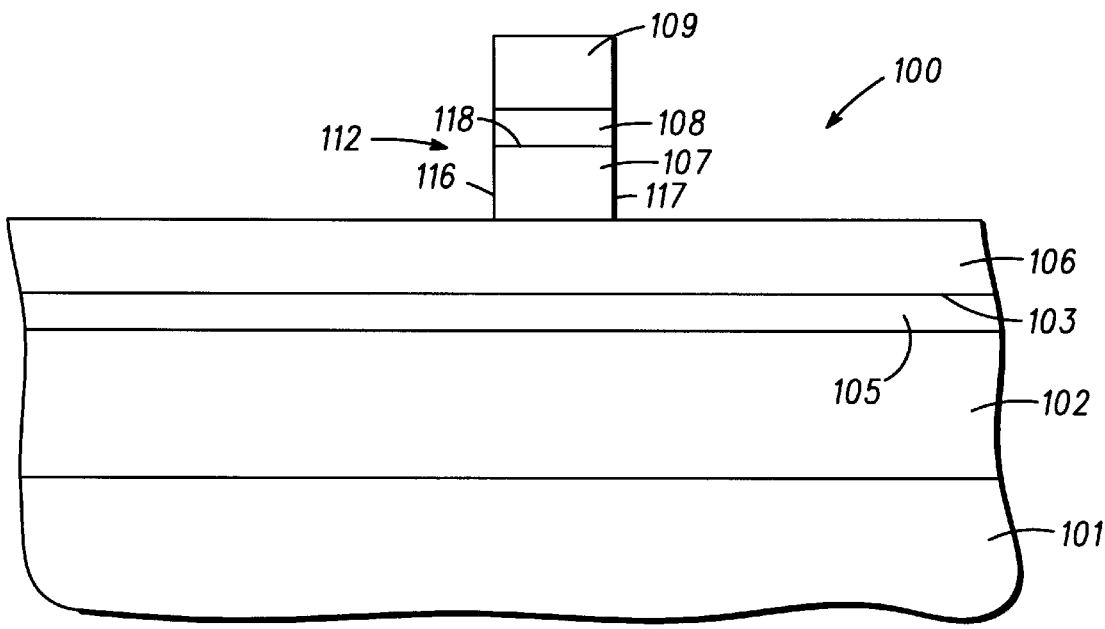

Now referring to FIG. 4, a portion 112 of the gate structure is formed over a portion of P-type epitaxial layer 102. Gate shunt portion 112 forms part of gate structure 141 as shown and further described in FIG. 10. It should be noted that portion 112 is formed from polysilicon layer 107 and that portion 112 has sides 116 and 117, and a top surface 118. Portion 112 serves as a gate shunt portion of the gate structure and is formed by anisotropically etching nitride layer 109, oxide layer 108, and polysilicon layer 107. Gate shunt portion 112 may be formed, for example, by coating silicon nitride layer 119 with a layer of photoresist (not shown), exposing the portions of silicon nitride layer 119 to be removed (using, for example, photolithographic techniques), and anisotropically etching the exposed portions of silicon nitride layer 109. In addition, the portions of oxide layer 108 and polysilicon layer 107 below the exposed portions of silicon nitride layer 109 are also etched, thereby exposing portions of oxide layer 106.

Figure 5:
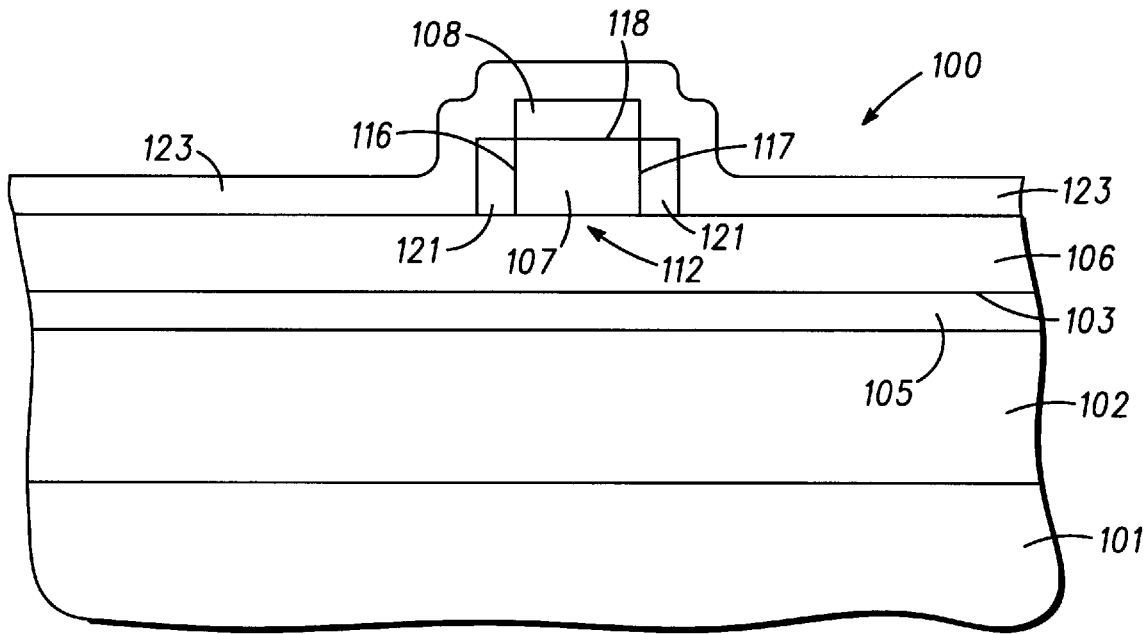

Now referring to FIG. 5, silicon nitride layer 109 is removed. A layer of oxide 121 is formed on exposed sides 116 and 117 of gate shunt portion 112. By way of example, oxide layer 121 is formed by thermally oxidizing sides 116 and 117. A suitable thickness range for oxide layer 121 is between approximately 50 Å and approximately 250 Å, and a nominal thickness of oxide layer 121 is approximately 100 Å. Although the formation of oxide layer 121 by thermal oxidization increases the thickness of oxide layer 106, the increased thickness of layer 106 is not shown to simplify the description of the present invention.

A conformal layer of dielectric material 123 is formed on gate shunt portion 112 as well as on oxide layer 106. By way of example, layer of dielectric material 123 is silicon nitride having a thickness ranging from approximately 250 Å to approximately 750 Å, and a nominal thickness of approximately 400 Å. It should be noted that the impurity materials of doped layer 105 is activated or driven into P-type epitaxial layer 102 by the processing steps described supra.

Figure 6:
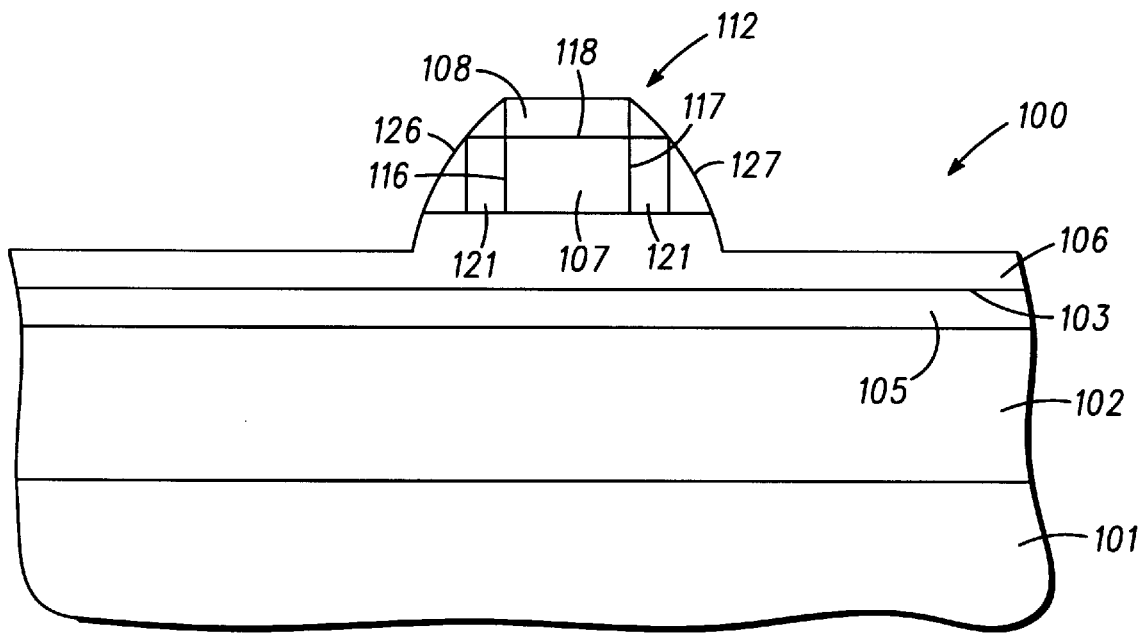

Now referring to FIG. 6, silicon nitride layer 123 is anisotropically etched to form spacers 126 and 127 adjacent oxide layer 121. A suitable technique for etching silicon nitride layer 123 includes a reactive ion etch (RIE) using etchants such as carbon tetrafluoride, ammonia trifluoride, or the like. In addition, the anisotropic etch step may remove a portion of oxide layer 106. For example, oxide layer 106 is thinned to approximately 400 Å after the formation of spacers 126 and 127. It should be noted that spacer 126 shapes oxide layer 106 in order to create a repeatable undercut etch profile (shown in FIG. 7) and that spacer 127 protects portions of oxide layer 106.

Figure 7:
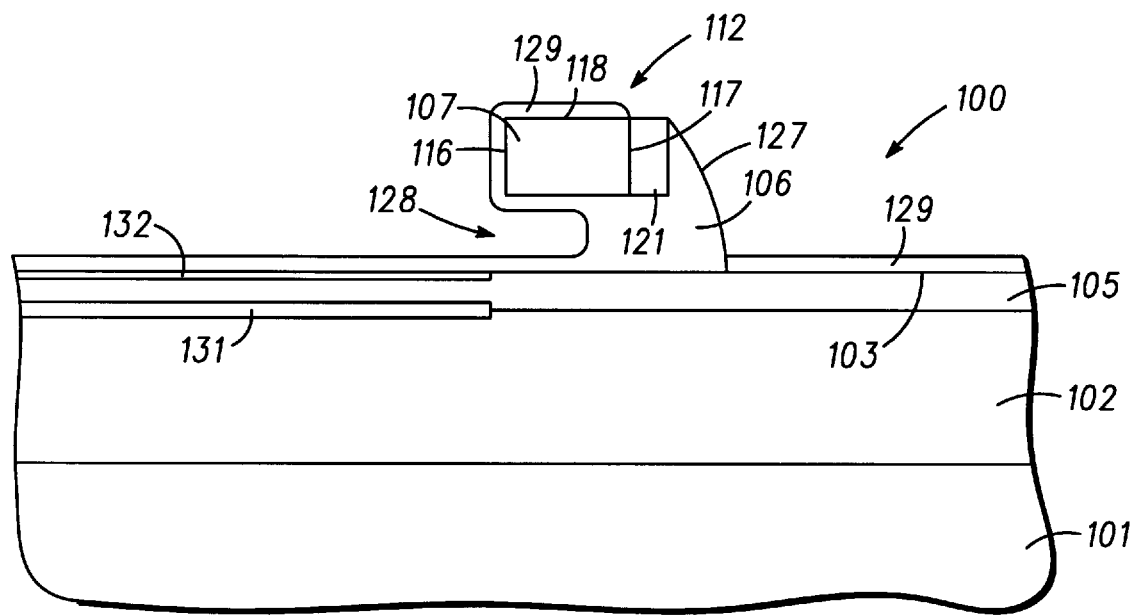

Now referring to FIG. 7, a layer of photoresist (not shown) is formed on a subportion of gate shunt portion 112 on spacer 127. Spacer 126 and the portions of oxide layers 106 and 108 which are not covered by the layer of photoresist are removed via a sequence of isotropic etches, i.e., a first etch step to remove spacer 126 and a second etch step to remove portions of oxide layer 106 between gate shunt portion 112 and a first portion of major surface 103. In other words, gate shunt portion 112 is undercut on one side to form a cavity 128 underneath gate shunt portion 112, i.e., between gate shunt portion 112 and a portion of major surface 103. The layer of photoresist is removed. Preferably, the width of the portion of oxide layer 106 between gate shunt portion 112 and the portion of major surface 103 is approximately equal to the thickness of the oxide layer 106.

A screen oxide 129 is formed on the exposed portions of gate shunt portion 112 and on the exposed portions of major surface 103. By way of example, oxide layer 129 has a thickness ranging from approximately 100 Å to approximately 200 Å, with a nominal thickness of approximately 150 Å. A layer of photoresist (not shown) is formed on portions of oxide layer 129 disposed on gate shunt portion 112, spacer 127, portions of oxide layer 129 adjacent side 117. This layer of photoresist serves as an implant block mask.

An enhanced doped region 131 is formed by doping a portion of P-type epitaxial layer 102 with an impurity material of P conductivity type such as, for example, boron. More particularly, the boron is implanted into a portion of P-type epitaxial layer 102 to form doped region 131. Doped region 131 is laterally aligned to oxide layer 129 disposed on side 116 of gate shunt portion 112. It should be noted that doped region 131 is spaced apart from major surface 103. A suitable set of implant parameters includes implanting the P type impurity material at a dose ranging from approximately $2\times10^{12}$ atoms/cm$^2$ to approximately $2\times10^{13}$ atoms/cm$^2$ at an implant energy ranging from approximately 40 KeV to approximately 100 KeV. Thus, the boron that forms doped region 131 is implanted into P-type epitaxial layer 102 to a depth or distance ranging between approximately 1,500 Å and approximately 3,000 Å. The impurity materials or dopant forming doped region 131 serve to provide punch-through protection for transistor 100.

An enhanced doped region 132 is formed by doping another portion of P-type epitaxial layer 102 with boron. By way of example, implant parameters for the formation of doped region 132 include a dose ranging from approximately $5\times10^{11}$ atoms/cm$^2$ to approximately $1\times10^{13}$ atoms/cm$^2$ and a suitable implant energy ranging from approximately 10 KeV to approximately 20 KeV. Thus the boron that forms doped region 132 is implanted into a portion of P-type epitaxial layer 102 to a depth or distance ranging from approximately 200 Å to approximately 1,200 Å. The impurity materials forming doped region 132 serve to adjust the threshold voltage of transistor 100.

Figure 8:
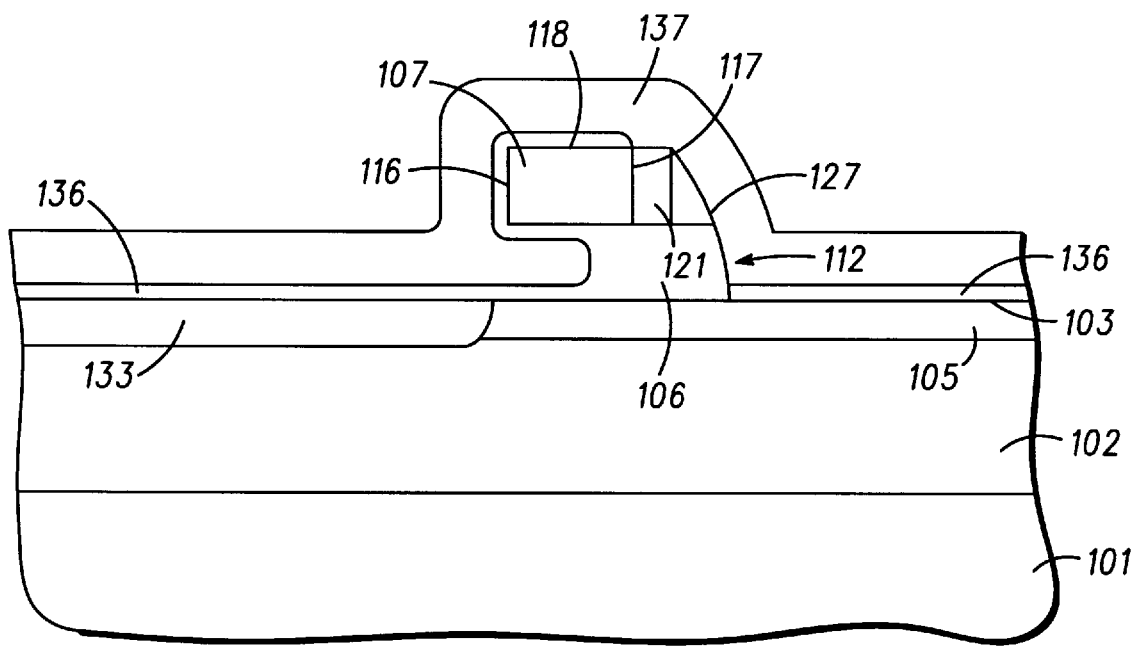

Now referring to FIG. 8, screen oxide 129 is removed from gate shunt portion 112 and portions of major surface 103, thereby exposing subportions of gate shunt portion 112 and portions of major surface 103. An oxide layer 136 is formed on the exposed portions of major surface 103 and the exposed regions of gate shunt portion 112.

One of a conformal layer of semiconductor material or a conductor material 137 including, for example, amorphous silicon, single crystal silicon, polysilicon, tungsten, or the like, is formed on oxide 136, the remaining portions of oxide layer 121, and spacer 127. By way of example, layer 137 is a layer of polysilicon having a thickness ranging between approximately 1,000 Å and approximately 2,500 Å deposited on oxide layers 136, 121, and on spacer 127. Nominally, layer 137 has a thickness of approximately 1,750 Å. Although doped regions 131 and 132 are initially spaced apart, it should be noted that they diffuse towards each other and form a single doped region 133.

Figure 9:
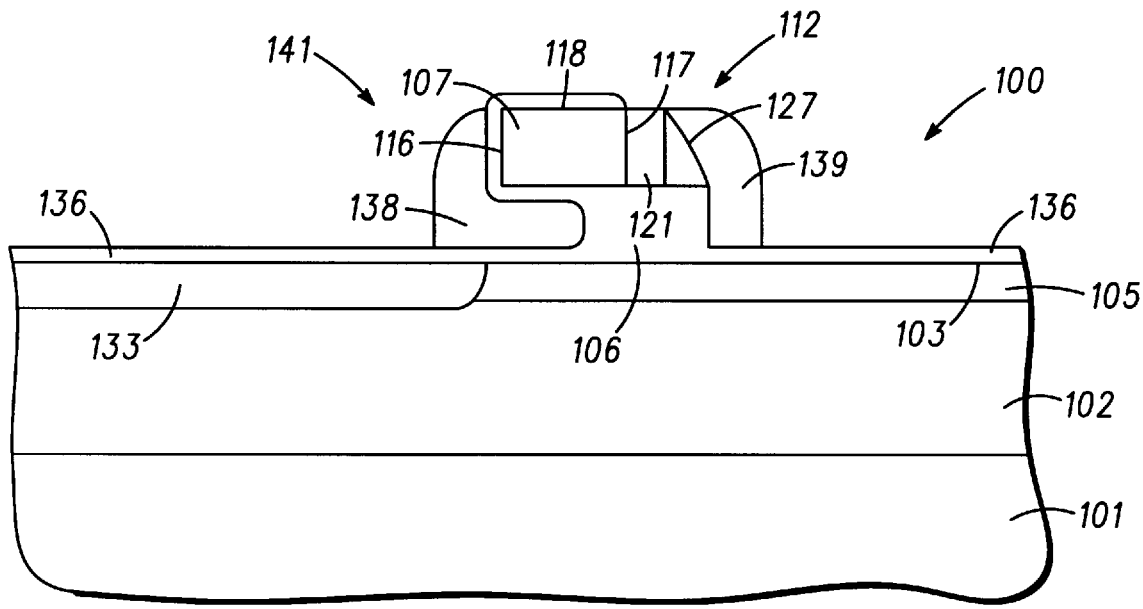

Now referring to FIG. 9, polysilicon layer 137 is anisotropically etched to form a gate extension 138 adjacent side 116. It should be noted that gate extension 138 is spaced apart from the side 116 by the portion of oxide layer 136. In addition, an extension 139 is formed adjacent spacer 127. The anisotropic etch step that forms gate extensions 138 and 139 stops on or in oxide layer 136. Thus, gate structure 141 comprises a gate shunt portion 112 formed from a first polysilicon portion on the oxide layer 106 of a first width and a gate extension portion 138 formed from a second polysilicon portion on a portion of oxide layer 136 of a second width, wherein the second width is less than the first width.

Figure 10:
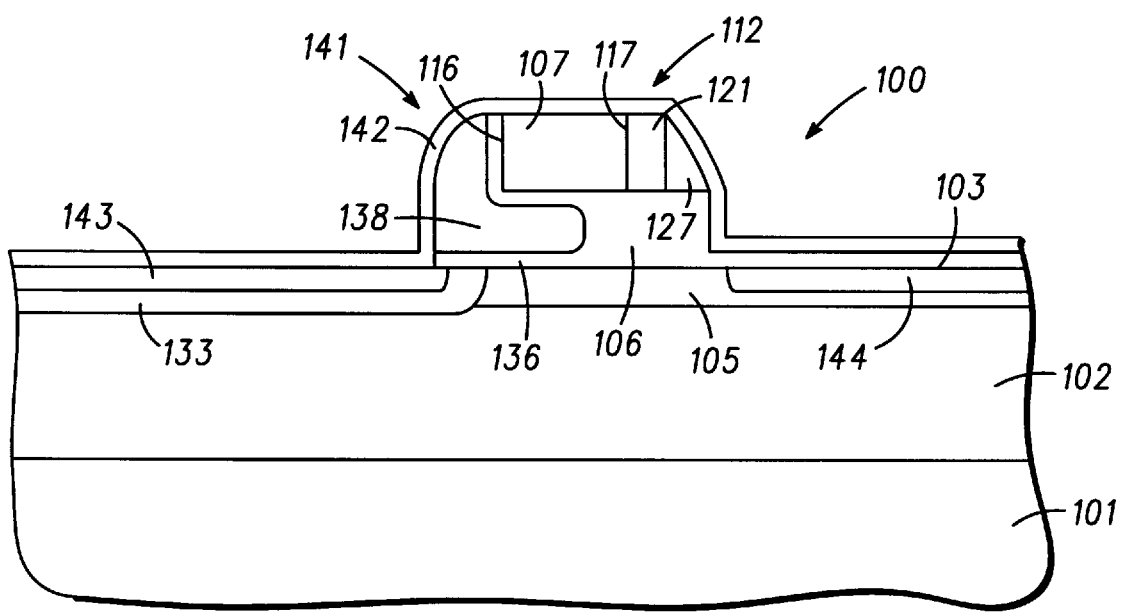

Now referring to FIG. 10, a layer of photoresist (not shown) is formed on gate shunt portion 112, gate extension 138, and the portions of oxide layer 136 adjacent gate extension 138. In other words, gate extension 139 (shown in FIG. 9) and the portions of oxide layer 136 adjacent gate extension 139 are uncovered by photoresist, i.e., they are exposed. The layer of photoresist serves as an etch protect mask. Gate extension 139 and spacer 127 are removed using, for example, an isotropic plasma etch. It should be noted that spacer 127 may be either completely removed or partially removed. In addition, the exposed portions of oxide layer 136 are also removed. The layer of photoresist is removed.

It should be understood that gate extension 138 cooperates with gate shunt portion 112 and the portions of oxide layer 136 on P-type epitaxial layer 102 to form gate structure 141. The portions of oxide layer 136 between gate extension 138 and major surface 103 serves as an active gate oxide.

An oxide layer 142 is conformally deposited on the remaining portions of oxide layer 136, oxide layer 121, spacer 127, and gate extension 138. By way of example, oxide layer 142 has a thickness ranging from approximately 100 Å to approximately 300 Å, wherein a nominal thickness of oxide layer 142 is approximately 150 Å.

A layer of photoresist (not shown) is formed on the portions of the layer of dielectric material 142 over gate structure 141. A source/drain implant is performed to form a source region 143 and a drain region 144. In addition, the source/drain implant further dopes gate structure 141. A suitable set of implant parameters for the source/drain implant includes implanting an N type impurity material such as arsenic, at a dose in the range of approximately $1\times10^{15}$ atoms/cm$^2$ to approximately $1\times10^{16}$ atoms/cm$^2$, and a suitable implant energy ranges from approximately 60 KeV to approximately 120 KeV.

The layer of photoresist is then removed. A layer of silicon nitride (not shown) having a thickness of approximately 2,000 Å is formed on oxide layer 142. The nitride layer and oxide layer 142 are anisotropically etched to form self-aligned silicide protect spacers (not shown). Using techniques well known in the art, silicide electrode contacts (not shown) are formed to contact source region 142, drain region 144, and gate structure 141. It should be understood that the electrode contact to gate structure 141 also forms a conductive strap that electrically connects gate extension 138 to polysilicon layer 107 of gate shunt portion 112.

It should be understood that, when using the fabrication process described with reference to FIGS. 3–10 to fabricate differential amplifier 10, transistors 12, 14, and 16 are preferably fabricated simultaneously in a common well, thereby simplifying the process and maintaining a high packing density. It should be further understood that, although the fabrication of a N-channel transistor is described herein, this is not a limitation of the present invention. The described process can be modified to fabricate a P-channel unilateral field effect transistor.

By now it should be appreciated that a differential amplifier and a process of manufacturing the differential amplifier have been provided. The differential amplifier fabricated in accordance with the present invention includes three unilateral field effect transistors. Because of the higher transconductance, higher current carrying capability, and smaller gate capacitance of the unilateral field effect transistors, the differential amplifier of the present invention has improved performance, such as higher gain, higher output impedance, higher frequency response, wider bandwidth, etc. compared with a differential amplifier fabricated in a conventional MOS process. Furthermore, the three unilateral transistors of the differential amplifier are preferably fabricated in a common well to increase the packing density of an integrated circuit which includes the differential amplifier.

While specific embodiments of the present invention have been described, further modifications and improvements will occur to those skilled in the art. It is understood that the present invention is not limited to the particular forms shown and it is intended for the appended claims to cover all modifications of the present invention which fall within the true spirit and scope of the invention. For example, a unilateral field effect transistor may have a higher dopant concentration near its drain side than its source side. Further, the three transistors of the differential amplifier are not limited to being fabricated in a common well.

We claim:

1. A process of fabricating a differential amplifier, comprising the steps of:

providing a semiconductor material;

forming first, second, and third unilateral field effect transistors in the semiconductor material, wherein a source of the first unilateral field effect transistor and a source of the second unilateral field effect transistor are coupled to a drain of the third unilateral field effect transistor;

forming drain contacts for the first and second unilateral field effect transistors; and forming a source contact for the third unilateral field effect transistor.

2. The process of claim 1, wherein the step of forming first, second, and third unilateral field effect transistors includes the steps of:

forming a well of a first conductivity type in the semiconductor material; and forming the first, second, and third unilateral field effect transistors in the well.

3. The process of claim 2, wherein the step of forming first, second, and third unilateral field effect transistors includes the steps of:

forming a first gate of the first unilateral field effect transistor, a second gate of the second unilateral field effect transistor, and a third gate of the third unilateral field effect transistor over portions of the well, each of the first, second, and third gates having a first side and a second side;

doping portions of the well in the semiconductor material adjacent the first sides of the first, second, and third gates with a dopant of the first conductivity type; and forming a doped region of a second conductivity type adjacent the first side of the first gate, the first side of the second gate, and the second side of the third gate, the doped region serving as the source of the first unilateral field effect transistor, the source of the second unilateral field effect transistor, and the drain of the third unilateral field effect transistor.

4. The process of claim 3, wherein the step of forming first, second, and third gates includes the steps of:

forming a layer of dielectric material on a major surface of the semiconductor material;

forming a conductive layer on the layer of dielectric material; and patterning the conductive layer to form the first, second, and third gates.

5. The process of claim 4, wherein the step of forming a conductive layer includes forming a polycrystalline silicon layer.

6. The process of claim 4, wherein the step of forming a layer of dielectric material includes forming an oxide layer having a thickness ranging from approximately 25 angstroms to approximately 250 angstroms.

7. The process of claim 3, wherein the step of forming first, second, and third unilateral field effect transistors includes doping portions of the well in the semiconductor material adjacent the second sides of the first, second, and third gates with a dopant of the second conductivity type.

8. A process of fabricating a differential amplifier having a first transistor, a second transistor, and a current sink transistor, comprising the steps of:

providing a semiconductor material of a first conductivity type and having a major surface;

forming a first doped layer of a second conductivity type and extending from the major surface into the semiconductor material;

forming a first layer of dielectric material on the major surface;

forming a first conductive layer on the first layer of dielectric material;

patterning the first conductive layer to form a first portion of a first gate structure, a first portion of a second gate structure, and a first portion of a third gate structure, each of the first portions of the first, second, and third gate structures having a first side and a second side, and being spaced apart from the major surface by the first layer of dielectric material;

laterally removing portions of the first layer of dielectric material to form first, second, and third cavities, wherein the first cavity is between the first portion of the first gate structure and the major surface and adjacent the first side of the first portion of the first gate structure, the second cavity is between the first portion of the second gate structure and the major surface and adjacent the first side of the first portion of the second gate structure, and the third cavity is between the first portion of the third gate structure and the major surface and adjacent the first side of the first portion of the third gate structure;

forming a second layer of dielectric material adjacent first sides of the first portions of the first, second, and third gate structures and at least partially filling the first, second, and third cavities;

doping portions of the semiconductor material adjacent the first sides of the first portions of the first, second, and third gate structures with impurities of the first conductivity type;

forming second portions of the first, second, and third gate structures, wherein the second portion of each of the first, second, and third gate structures has a first side and a second side, the first side being spaced apart from the first side of the first portion of the respective gate structure by the second layer of dielectric material filling a portion of the respective cavity;

doping a portion of the semiconductor material adjacent the second side of the second portion of the first gate structure, the second side of the second portion of the second gate structure, and the second side of the first portion of the third gate structure to form a doped region of the second conductivity type, the doped region serving as a source region of the first transistor, a source region of the second transistor, and a drain region of the current sink transistor;

doping a portion of the semiconductor material adjacent the second side of the first portion of the first gate structure to form a drain region of the first transistor;

doping a portion of the semiconductor material adjacent the second side of the first portion of the second gate structure to form a drain region of the second transistor;

doping a portion of the semiconductor material adjacent the second side of the second portion of the third gate structure to form a source region of the current sink transistor; and doping a portion of each of the first, second, and third gate structures.

9. The process of claim 8, wherein the step of laterally removing portions of the first layer of dielectric material to form first, second, and third cavities includes exposing the first sides of the first portions of the first, second, and third gate structures.

10. The process of claim 8, wherein the step of laterally removing portions of the first layer of dielectric material to form first, second, and third cavities includes exposing portions of the major surface adjacent the first, second, and third cavities.

11. The process of claim 10, wherein the step of forming the second layer of dielectric material includes forming the second layer of dielectric material on portions of the major surface adjacent the first and second sides of the first, second, and third gate structures, on the portions of the major surface below the first, second, and third gate structures that are exposed, and on the first portions of the first, second, and third gate structures.

12. The process of claim 8, wherein the step of laterally removing portions of the first layer of dielectric material to form first, second, and third cavities includes removing the portions of the first layer of dielectric material having a width of approximately a thickness of the first layer of dielectric material.

13. The process of claim 8, wherein the step of forming a first conductive layer on the first layer of dielectric material includes forming a first polysilicon layer on the first layer of dielectric material and the step of forming second portions of the first, second, and third gate structures includes forming a second polysilicon layer on a portion of the second layer of dielectric material.

14. The process of claim 8, further including the steps of forming a first conductive strap to electrically couple the first portion of the first gate structure to the second portion of the first gate structure, forming a second conductive strap to electrically couple the first portion of the second gate structure to the second portion of the second gate structure, and forming a third conductive strap to electrically couple the first portion of the third gate structure to the second portion of the third gate structure.

* * * * *